United States Patent
Li et al.

(10) Patent No.: US 9,524,880 B2
(45) Date of Patent: Dec. 20, 2016

(54) MASK AND METHOD FOR MANUFACTURING SEMICONDUCTOR DEVICE

(71) Applicant: Semiconductor Manufacturing International (Shanghai) Corporation, Shanghai (CN)

(72) Inventors: Shaobin Li, Shanghai (CN); Yun Yang, Shanghai (CN); Shengfin Chiu, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 14/739,876

(22) Filed: Jun. 15, 2015

(65) Prior Publication Data
US 2016/0020106 A1    Jan. 21, 2016

(30) Foreign Application Priority Data
Jul. 18, 2014    (CN) .......................... 2014 1 0345526

(51) Int. Cl.
  *H01L 21/285*    (2006.01)
  *H01L 21/311*    (2006.01)
  *H01L 21/768*    (2006.01)
  *H01L 21/308*    (2006.01)

(52) U.S. Cl.
CPC .... *H01L 21/31144* (2013.01); *H01L 21/31116* (2013.01); *H01L 21/76816* (2013.01); *H01L 21/76897* (2013.01); *H01L 21/3088* (2013.01)

(58) Field of Classification Search
None
See application file for complete search history.

(56) References Cited

U.S. PATENT DOCUMENTS

| | | | |
|---|---|---|---|
| 2001/0002731 A1* | 6/2001 | Ueda | H01L 21/76802 257/750 |
| 2002/0102854 A1* | 8/2002 | Givens | H01L 21/31144 438/692 |
| 2007/0249151 A1* | 10/2007 | Kadoya | H01L 21/76897 438/597 |
| 2008/0157208 A1* | 7/2008 | Fischer | H01L 21/76843 257/368 |

(Continued)

*Primary Examiner* — Angel Roman
(74) *Attorney, Agent, or Firm* — Innovation Counsel LLP (57) ABSTRACT

A mask may be used in a process for manufacturing a semiconductor device. The semiconductor device may include a source line, a first drain contact terminal, and a second drain contact terminal. The mask may include the following elements: a source-line corresponding light-transmitting portion, which corresponds to the source line; a first-drain-contact-terminal corresponding light-transmitting portion, which corresponds to the first drain contact terminal; a second-drain-contact-terminal corresponding light-transmitting portion, which corresponds to the second drain contact terminal; and a first light-blocking portion, which abuts at least one of the source-line corresponding light-transmitting portion, the first-drain-contact-terminal corresponding light-transmitting portion, and the second-drain-contact-terminal corresponding light-transmitting portion.

20 Claims, 4 Drawing Sheets

(56) References Cited

U.S. PATENT DOCUMENTS

| | | | |
|---|---|---|---|
| 2012/0326237 A1* | 12/2012 | Ponoth | H01L 21/76895 257/368 |
| 2014/0363984 A1* | 12/2014 | Fukuda | H01L 21/0274 438/778 |

\* cited by examiner

| S301 Forming a transistor that may include a gate electrode, a source electrode, and a drain electrode. |

↓

| S302 Forming a dielectric layer on the transistor. A first portion of the dielectric layer may overlap the source electrode; a second portion of the dielectric layer may overlap the drain electrode. |

↓

| S303 Using a mask for removing the first portion of the dielectric layer to form a first space when using the mask for removing the second portion of the dielectric layer to form a second space. |

↓

| S304 Providing a first conductive material set in the first space for forming a source line when providing a second conductive material set in the second space for forming a first drain contact terminal |

MASK AND METHOD FOR MANUFACTURING SEMICONDUCTOR DEVICE

CROSS-REFERENCE TO RELATED APPLICATION

This application claims priority to and benefit of Chinese Patent Application No. 201410345526.3, filed on 18 Jul. 2014, the Chinese Patent Application being incorporated herein by reference in its entirety.

BACKGROUND OF THE INVENTION

The present invention is related to a mask for use in manufacturing of a semiconductor device and is related to a method that may involve the mask.

A semiconductor device, such as a memory device or a logic device, may include a transistor. The transistor may include a source electrode and a drain electrode. In a process for manufacturing the semiconductor device, a source line and drain contact terminal respectively connected to the source electrode and the drain electrode may need to be formed, such that the transistor may be properly connected to a peripheral circuit and/or to other elements.

SUMMARY

An embodiment of the present invention may be related to a mask for use in a process for manufacturing a semiconductor device. The semiconductor device may include a source line, a first drain contact terminal, and a second drain contact terminal. The mask may include a source-line corresponding light-transmitting portion, which may correspond to the source line. The mask may further include a first-drain-contact-terminal corresponding light-transmitting portion, which may correspond to the first drain contact terminal. The mask may further include a second-drain-contact-terminal corresponding light-transmitting portion, which may correspond to the second drain contact terminal. The mask may further include a first light-blocking portion, which may abut at least one of the source-line corresponding light-transmitting portion, the first-drain-contact-terminal corresponding light-transmitting portion, and the second-drain-contact-terminal corresponding light-transmitting portion.

The first light-blocking portion may be positioned between the first-drain-contact-terminal corresponding light-transmitting portion and the second-drain-contact-terminal corresponding light-transmitting portion in a direction parallel to a longitudinal direction of the source-line corresponding light-transmitting portion in a plan view of the mask.

The source-line corresponding light-transmitting portion may be positioned between the first-drain-contact-terminal corresponding light-transmitting portion and the second-drain-contact-terminal corresponding light-transmitting portion in a plan view of the mask.

A longitudinal direction of the first-drain-contact-terminal corresponding light-transmitting portion may be perpendicular to a longitudinal direction of the source-line corresponding light-transmitting portion in a plan view of the mask.

The shape and/or position of the first-drain-contact-terminal corresponding light-transmitting portion and the shape and/or position of the second-drain-contact-terminal corresponding light-transmitting portion may be symmetrical to each other with reference to the source-line corresponding light-transmitting portion in a plan view of the mask.

The mask may include a second light-blocking portion, which may abut at least one of the source-line corresponding light-transmitting portion, the first-drain-contact-terminal corresponding light-transmitting portion, and the second-drain-contact-terminal corresponding light-transmitting portion. The size and/or shape of the second light-blocking portion may be unequal to (and/or different from) the size and/or shape of the first light-blocking portion.

An embodiment of the present invention may be related to a method for manufacturing semiconductor device. The method may include the following steps: forming a transistor that may include a gate electrode, a source electrode, and a drain electrode; forming a dielectric layer on the transistor, wherein a first portion of the dielectric layer may overlap the source electrode, and wherein a second portion of the dielectric layer may overlap the drain electrode; using a mask for removing the first portion of the dielectric layer to form a first space when using the mask for removing the second portion of the dielectric layer to form a second space; and providing a first conductive material set in the first space for forming a source line when providing a second conductive material set in the second space for forming a first drain contact terminal.

The mask may include the following elements: a source-line corresponding light-transmitting portion, which may correspond to the source line; a first-drain-contact-terminal corresponding light-transmitting portion, which may correspond to the first drain contact terminal; and a first light-blocking portion, which may abut at least one of the source-line corresponding light-transmitting portion and the first-drain-contact-terminal corresponding light-transmitting portion.

The semiconductor device may include a second drain contact terminal. The mask may include a second-drain-contact-terminal corresponding light-transmitting portion, which may correspond to the second drain contact terminal.

The first light-blocking portion may be positioned between the first-drain-contact-terminal corresponding light-transmitting portion and the second-drain-contact-terminal corresponding light-transmitting portion in a direction parallel to a longitudinal direction of the source-line corresponding light-transmitting portion in a plan view of the mask.

The source-line corresponding light-transmitting portion may be positioned between the first-drain-contact-terminal corresponding light-transmitting portion and the second-drain-contact-terminal corresponding light-transmitting portion in a plan view of the mask.

A longitudinal direction of the first-drain-contact-terminal corresponding light-transmitting portion may be perpendicular to a longitudinal direction of the source-line corresponding light-transmitting portion in a plan view of the mask.

The first-drain-contact-terminal corresponding light-transmitting portion and the second-drain-contact-terminal corresponding light-transmitting portion may be symmetrical to each other with reference to the source-line corresponding light-transmitting portion in a plan view of the mask.

The mask may include a second light-blocking portion, which may abut at least one of the source-line corresponding light-transmitting portion, the first-drain-contact-terminal corresponding light-transmitting portion, and the second-drain-contact-terminal corresponding light-transmitting portion. The size of the second light-blocking portion may be unequal to the size of the first light-blocking portion.

The method may include positioning the mask such that the source-line corresponding light-transmitting portion may overlap the source electrode and such that the first-drain-contact-terminal corresponding light-transmitting portion may overlap the drain electrode.

The method may include the following steps: forming a first metal silicide member on the source electrode; and forming a second metal silicide member on the drain electrode. The first conductive material set may overlap the first metal silicide member. The second conductive material set may overlap the second metal silicide member.

The dielectric layer may include an interlayer dielectric layer and an etch stop layer. Both of the source line and the first drain contact terminal may be formed after at least one of the interlayer dielectric layer and the etch stop layer has been removed.

The first conductive material set may be a first portion of a metal material layer, and the second conductive material set may be a second portion of the metal material layer.

The metal material layer may be formed of at least one of tungsten, cobalt, titanium, etc.

The method may include performing a planarization process on the first conductive material set and the second conductive material set to reduce a height of the first conductive material set and to reduce a height of the second conductive material set, such each of the source line and the drain contact terminal may not protrude beyond the gate electrode.

According to embodiments of the invention, in a process for manufacturing a semiconductor device, only one mask may be required for forming both a source line and a drain contact terminal. Advantageously, the process may be substantially efficient and cost-effective, and the manufacturing cost associated with the semiconductor device may be substantially minimized.

The above summary may be related to some of many embodiments of the invention disclosed herein and may be not intended to limit the scope of the invention.

DETAILED DESCRIPTION

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Figure 1:
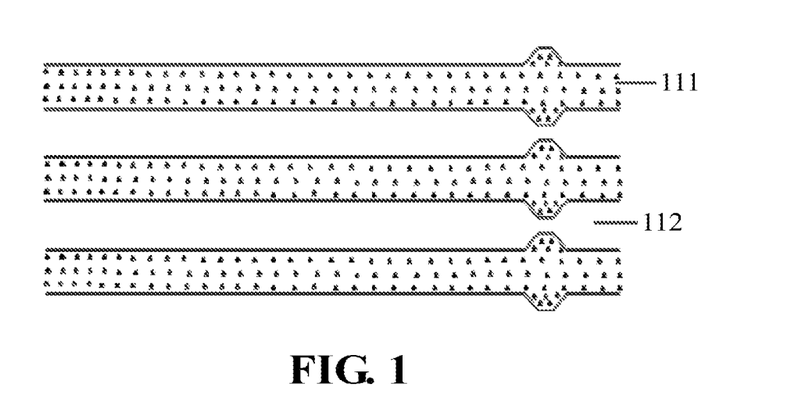
FIG. 1 shows a schematic diagram (e.g., a schematic plan view) that illustrates elements of a mask used for forming a source line in accordance with one or more embodiments of the present invention.
Figure 2:
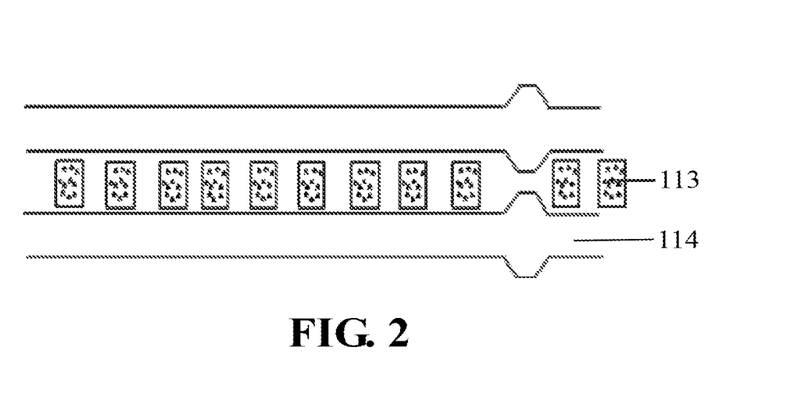
FIG. 2 shows a schematic diagram (e.g., a schematic plan view) that illustrates elements of a mask used for forming a drain contact terminal in accordance with one or more embodiments of the present invention.

FIG. 1 shows a schematic diagram (e.g., a schematic plan view) that illustrates elements of a first mask used for forming a source line in accordance with one or more embodiments of the present invention. The first mask may include a light-transmitting region 111 and a light-blocking region 112. FIG. 2 shows a schematic diagram (e.g., a schematic plan view) that illustrates elements of a second mask used for forming a drain contact terminal in accordance with one or more embodiments of the present invention. The second mask may include a light-transmitting region 113 and a light-blocking region 114. A process of forming a semiconductor device may include the following steps: forming a gate electrode of the transistor on a substrate; using the first mask to form a source line pattern mask; using the source line pattern mask to form the source line (e.g., through ion implantation) in the substrate; forming sidewalls on two opposite sides of the gate electrode; forming the source electrode and the drain electrode of the transistor in the substrate at the two opposite sides of the gate electrode; forming a metal silicide layer on each of the source electrode and the drain electrode; forming a dielectric layer on the transistor; using the second mask to form a drain contact hole pattern mask; using the drain contact hole pattern mask for etching the dielectric layer to form a drain contact hole; depositing a metal material in the drain contact hole; and planarizing the metal material to form the drain contact terminal.

Figure 3:
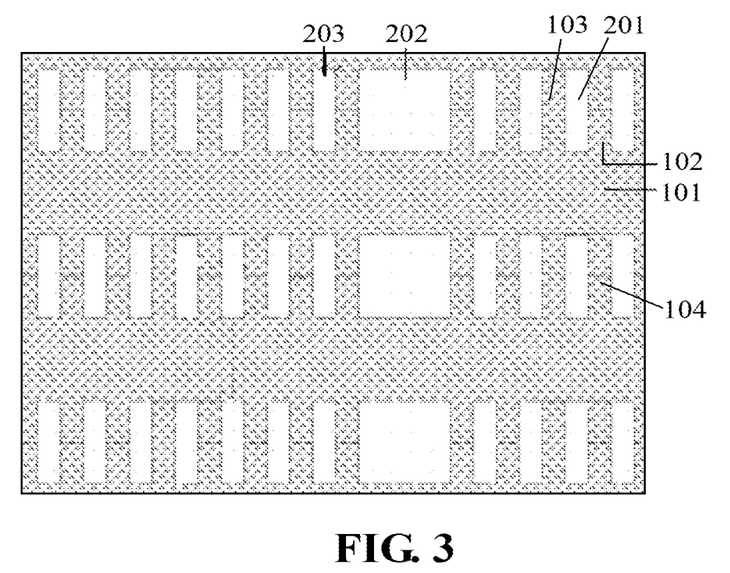
FIG. 3 shows a schematic diagram (e.g., a schematic plan view) that illustrates elements of a mask in accordance with one or more embodiments of the present invention.

FIG. 3 shows a schematic diagram (e.g., a schematic plan view) that illustrates elements of a mask in accordance with one or more embodiments of the present invention. The mask may be used in a process for manufacturing a semiconductor device. The semiconductor device may include one or more source lines and one or more drain contact terminals. The mask may include one or more source-line corresponding light-transmitting portions, which may correspond to the one or more source lines for use in forming the one or more source lines in the manufacturing of the semiconductor device. The mask may further include one or more drain-contact-terminal corresponding light-transmitting portions, which may correspond to the one or more drain contact terminals for use in forming the one or more drain contact terminals in the manufacturing of the semiconductor device. The mask may further include one or more light-blocking portions, which may neighbor the light-transmitting portions.

For example, the mask may include a source-line corresponding light-transmitting portion 101, which may correspond to a source line to be formed in the semiconductor device. The mask may further include a first-drain-contact-terminal corresponding light-transmitting portion 102, which may correspond to a first drain contact terminal to be formed in the semiconductor device. The mask may further include a second-drain-contact-terminal corresponding light-transmitting portion 103, which may correspond to a second drain contact terminal to be formed in the semiconductor device. The mask may further include a third-drain-contact-terminal corresponding light-transmitting portion 104, which may correspond to a third drain contact terminal to be formed in the semiconductor device. The mask may further include a first light-blocking portion 201, which may abut at least one of (e.g., all of) the source-line corresponding light-transmitting portion 101, the first-drain-contact-terminal corresponding light-transmitting portion 102, and the second-drain-contact-terminal corresponding light-transmitting portion 103.

The first light-blocking portion 201 may be positioned between the first-drain-contact-terminal corresponding light-transmitting portion 102 and the second-drain-contact-terminal corresponding light-transmitting portion 103 in a direction parallel to a longitudinal direction of the source-line corresponding light-transmitting portion 101 in a plan view of the mask. In an embodiment, drain-contact-terminal corresponding light-transmitting portions of the mask and light-blocking portions of the mask may be alternately arranged in the direction parallel to the longitudinal direction of the source-line corresponding light-transmitting portion 101 in the plan view of the mask.

The source-line corresponding light-transmitting portion 101 may be positioned between the first-drain-contact-terminal corresponding light-transmitting portion 102 and the third-drain-contact-terminal corresponding light-transmitting portion 104 in a plan view of the mask.

The first light-blocking portion 201 may be directly connected to or spaced from the first-drain-contact-terminal corresponding light-transmitting portion 102.

A longitudinal direction of the first-drain-contact-terminal corresponding light-transmitting portion 102 may be perpendicular to a longitudinal direction of the source-line corresponding light-transmitting portion 101 in a plan view of the mask.

The shape and/or position of the first-drain-contact-terminal corresponding light-transmitting portion 102 and the shape and/or position of the third-drain-contact-terminal corresponding light-transmitting portion 104 may be symmetrical to each other with reference to the source-line corresponding light-transmitting portion 101 in a plan view of the mask.

The mask may include a second light-blocking portion 202, which may abut the source-line corresponding light-transmitting portion 101 and/or one or more drain-contact-terminal corresponding light-transmitting portions. The size and/or shape of the second light-blocking portion 202 may be unequal to (and/or different from) the size and/or shape of the first light-blocking portion 201.

The mask may include a third light-blocking portion 203. The second light-blocking portion 202 may be positioned between the third light-blocking portion 203 and the first light-blocking portion 201. The size and/or shape of the third light-blocking portion 203 may be substantially equal to (and/or substantially identical to) the size and/or shape of the first light-blocking portion 201.

The positions, sizes, shapes, relations, etc. of the light-transmitting portions and light-blocking portions of the mask may be configured according to intended layout of source lines and drain contact terminals in a semiconductor device to be manufactured.

The mask may be used for substantially simultaneously forming both a source line and a drain contact terminal in the semiconductor device in a same process step. For example, light may be provided through the light-transmitting portions of the mask to expose portions of a photoresist, such that patterned holes that correspond to intended positions and shapes of the source line and the drain contact terminal may be formed in the photoresist after the exposed portions have been removed. An etching process may be performed through the patterned holes of the photoresist to substantially simultaneously form spaces for accommodating the source line and the drain contact terminal in a same process step. Subsequently, a conductive material may be provided in the spaces to substantially simultaneously form the source line and the drain contact terminal in a same process step.

In comparison with well-known multi-mask requirements and related processes, such the two masks and associated processes discussed in the Background of the Invention section, a mask in accordance with one or more embodiments of the invention may advantageously enable efficiency improvement of a semiconductor device manufacturing process and may enable significant reduction of semiconductor device manufacturing cost.

Figure 4:
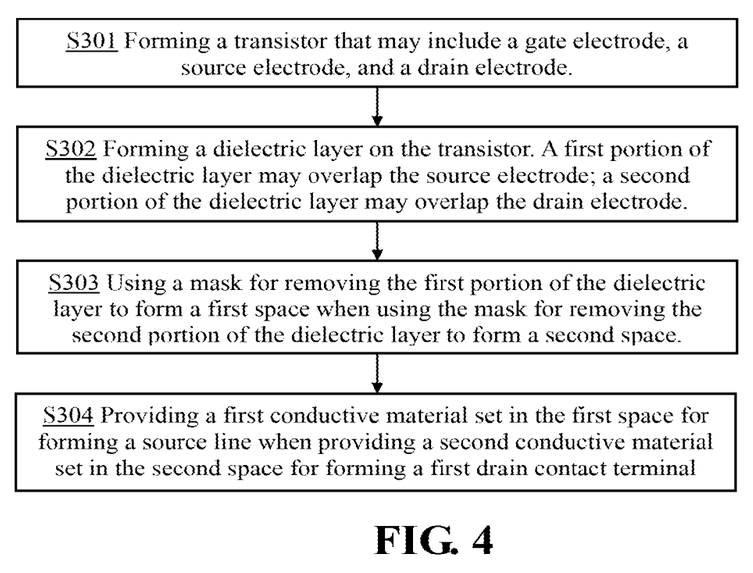
FIG. 4 shows a flowchart that illustrates a method for manufacturing a semiconductor device in accordance with one or more embodiments of the present invention.

FIG. 4 shows a flowchart that illustrates a method for manufacturing a semiconductor device in accordance with one or more embodiments of the present invention. FIG. 5, FIG. 6, FIG. 7, and FIG. 8 show schematic diagrams (e.g., schematic cross-sectional views) that illustrate structures formed in the method for manufacturing the semiconductor device in accordance with one or more embodiments of the present invention. A mask having both a source-line corresponding light-transmitting portion and a drain-contact-terminal corresponding light-transmitting portion, such as the mask discussed with reference to FIG. 3, may be used in the method.

Referring to FIG. 4, the method may include a step S301, a step S302, a step S303, and a step S304.

Figure 5:
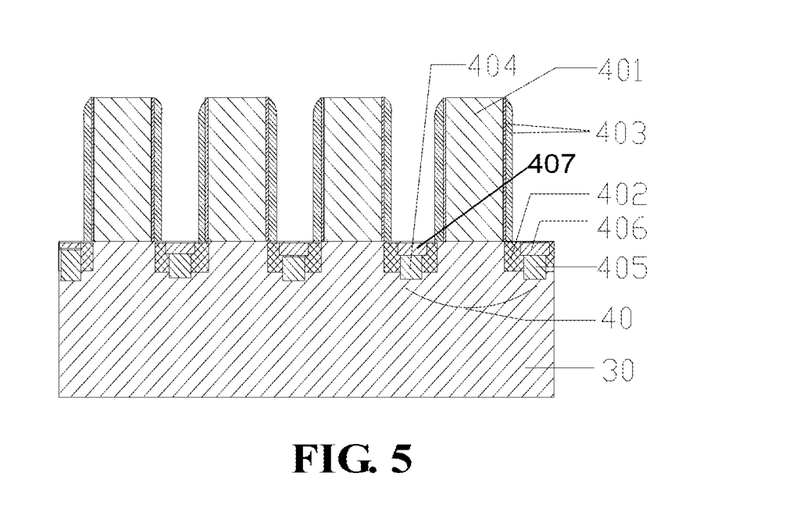
FIG. 5 shows a schematic diagram (e.g., a schematic cross-sectional view) that illustrates a structure formed in a method for manufacturing a semiconductor device in accordance with one or more embodiments of the present invention.

Referring to FIG. 4 and FIG. 5, the step S301 may include forming a transistor 40. The transistor 40 may include a gate electrode 401 formed on a substrate 30, a source electrode 404 formed in the substrate 30, a first metal silicide member 407 formed on the source electrode 404, a drain electrode 405 formed in the substrate 30, a second metal silicide member 406 formed on the drain electrode 405, sidewalls 403 formed on two opposite sides of the gate electrode 401, and lightly-doped regions 402 formed at the two opposite sides of the gate electrode 401 and in the substrate 30.

A process for forming the transistor 40 may include the following steps: forming the gate electrode 401 on the substrate 30; (subsequently) performing ion implantation at the two opposite sides of the gate electrode 401 to form the lightly-doped regions 402 in the substrate 30; (subsequently) forming the sidewalls 403 on the two opposite sides of the gate electrode 401; (subsequently) performing ion implantation at the two opposite sides of the gate electrode 401 to form the source electrode 404 and drain electrode 405 in the substrate 30; and (subsequently) forming the first metal silicide member 407 and the second metal silicide member 406 on the source electrode 404 and the drain electrode 405, respectively.

The gate electrode 401 may be formed of polycrystalline silicon or metal (e.g., copper) and may be formed through one or more of a chemical vapor deposition (CVD) process, a sputtering process, etc. A gate dielectric layer may be formed on the substrate 30, and the gate electrode 401 may be formed on the gate dielectric layer. The gate dielectric layer may be formed of, for example, silicon oxide.

The lightly-doped regions 402 may be formed through implantation of arsenic ions or phosphorus ions with a concentration in a range of 1E+14 atoms/cm^3 to 1E+15 atoms/cm^3. The lightly-doped regions 402 may have low resistance, may mitigate short-channel effects, and/or may minimize leakage current, such that the semiconductor device may have satisfactory performance.

The sidewalls 403 may include offset sidewalls and main sidewalls. The sidewalls may be formed of, for example, silicon oxide or silicon nitride and may be formed through one or more of a CVD process, a sputtering process, an evaporation process, etc.

The source electrode 404 and the drain electrode 405 may be formed through implantation of arsenic ions or phosphorus ions with a concentration in a range of 1E+14 atoms/cm^3 to 8E+18 atoms/cm^3.

The first metal silicide member 407 may minimize the resistance between the source electrode 404 and the corresponding source line. The second metal silicide member 406 may minimize the resistance the drain electrode 405 and the corresponding drain contact terminal. The metal silicide members 407 and 406 may be formed of one or more of titanium silicide, tungsten silicide, nickel silicide, etc. and may be formed through one or more of a sputtering process, a plating process, a CVD process, etc.

Figure 6:
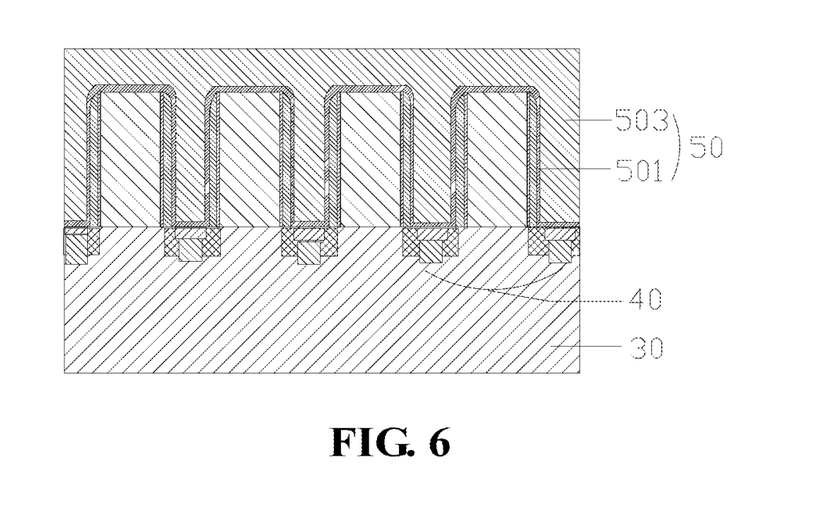
FIG. 6 shows a schematic diagram (e.g., a schematic cross-sectional view) that illustrates a structure formed in a method for manufacturing a semiconductor device in accordance with one or more embodiments of the present invention.

Referring to FIG. 4, FIG. 5, and FIG. 6, the step S302 may include forming a dielectric layer 50 on the transistor 40, wherein a first portion of the dielectric layer may overlap the source electrode 404, and wherein a second portion of the dielectric layer may overlap the drain electrode 405.

A process for forming the dielectric layer 50 may include the following steps: forming an etch-stop layer 501 on the transistor; and forming an interlayer dielectric layer 503 on the etch-stop layer 501.

The etch-stop layer 501 may be formed of one or more of silicon nitride and silicon oxynitride. The interlayer dielectric layer 503 may be formed of one or more of silicon oxide and silicon oxycarbide. Each of the etch-stop layer 501 and the interlayer dielectric layer 503 may be formed through one or more of a CVD process, an evaporation process, a sputtering process, etc.

Figure 7:
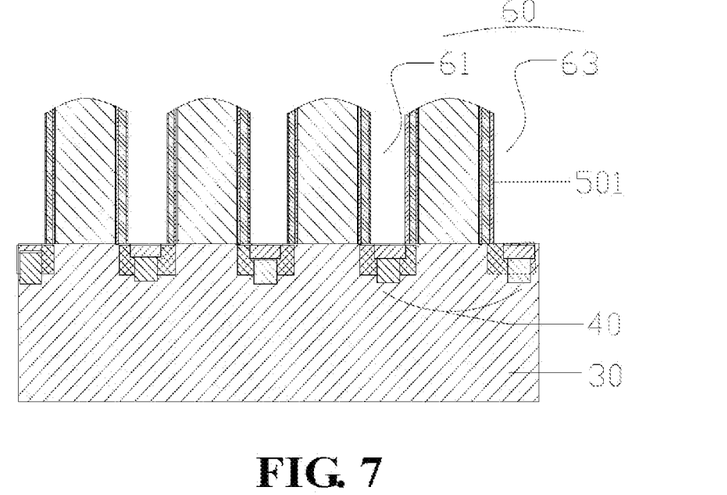
FIG. 7 shows a schematic diagram (e.g., a schematic cross-sectional view) that illustrates a structure formed in a method for manufacturing a semiconductor device in accordance with one or more embodiments of the present invention.

Referring to FIG. 4, FIG. 6, and FIG. 7, the step S303 may include using a mask according to one or more embodiments of the invention, such as the mask discussed with reference to FIG. 3, for removing the first portion of the dielectric layer 50 to form a first space 61 (e.g., a cavity between two remaining portions of the etch-stop layer 501) when using the mask for removing the second portion of the dielectric layer to form a second space 63 (e.g., a cavity between two remaining portions of the etch-stop layer 501). The first space 61 and the second space 63 may be among a plurality of spaces 60 formed in the dielectric layer 50 in a same process step using the mask.

A process for forming the first space 61 and the second space 63 may include the following steps: providing a photoresist layer on the dielectric layer 50; providing light through at least the source-line corresponding light-transmitting portion and the first-drain-contact terminal corresponding light-transmitting portion of the mask to expose portions of the photoresist; removing (e.g., using an etchant or a corrosive liquid) the exposed portions of the photoresist such that patterned holes that correspond to intended positions and shapes of the source line and the first drain contact terminal may be formed in the photoresist; performing an etching process (e.g., a dry etching process or a plasma etching process) through the patterned holes of the photoresist to substantially simultaneously form the first space 61 and the second space 63 in a same process step.

The method may include positioning the mask such that the source-line corresponding light-transmitting portion may overlap the source electrode 404 and such that the first-drain-contact-terminal corresponding light-transmitting portion may overlap the drain electrode 405.

Figure 8:
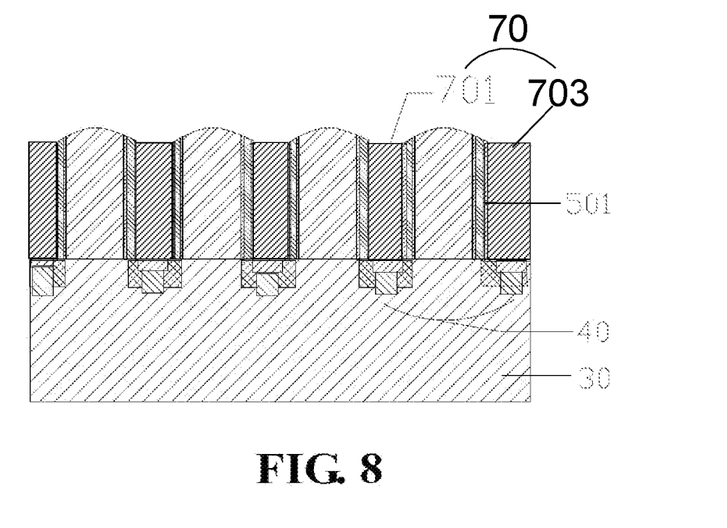
FIG. 8 shows a schematic diagram (e.g., a schematic cross-sectional view) that illustrates a structure formed in a method for manufacturing a semiconductor device in accordance with one or more embodiments of the present invention.

Referring to FIG. 4, FIG. 7, and FIG. 8, the step S304 may include providing a first conductive material set in the first space 61 for forming the source line 701 when providing a second conductive material set in the second space 63 for forming the first drain contact terminal 703.

Both of the source line 701 and the first drain contact terminal 703 may be formed after at least one of the interlayer dielectric layer 503 and the etch stop layer 501 has been removed.

The first conductive material set may overlap the first metal silicide member 407. The second conductive material set may overlap the second metal silicide member 406.

The first conductive material set may be a first portion of a metal material layer 70, and the second conductive material set may be a second portion of the metal material layer 70. A third portion of the metal material layer 70 may be formed on the gate electrode 401. The metal material layer 70 may be formed of at least one of tungsten, cobalt, titanium, etc. and may be formed through one or more of a CVD process, an evaporation process, a sputtering process, etc.

The method may include the following steps: reducing a height of the first conductive material set to be below a height of the gate electrode; and reducing a height of the second conductive material set to be below the height of the gate electrode 401. As a result, each of the height of the source line 701 and the height of the first drain contact terminal 703 may be below the height of the gate electrode 401. The height reduction process may include one or more of a planarization process, a chemical-mechanical polishing (CMP) process, an etch-back process, etc.

According to embodiments of the invention, in a process for manufacturing a semiconductor device, only one mask may be required for forming both source lines and drain contact terminals. Advantageously, the process may be substantially efficient and cost-effective, and the manufacturing cost associated with the semiconductor device may be substantially minimized.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A mask for use in manufacturing of a semiconductor device, the semiconductor device comprising a source line, a first drain contact terminal, and a second drain contact terminal, the mask comprising:
   a source-line corresponding light-transmitting portion, which corresponds to the source line;
   a first-drain-contact-terminal corresponding light-transmitting portion, which corresponds to the first drain contact terminal;
   a second-drain-contact-terminal corresponding light-transmitting portion, which corresponds to the second drain contact terminal and is smaller than the source-line corresponding light-transmitting portion; and
   a first light-blocking portion, which abuts at least one of the source-line corresponding light-transmitting portion, the first-drain-contact-terminal corresponding light-transmitting portion, and the second-drain-contact-terminal corresponding light-transmitting portion.

2. The mask of claim 1, wherein the first light-blocking portion is positioned between the first-drain-contact-terminal corresponding light-transmitting portion and the second-drain-contact-terminal corresponding light-transmitting portion in a direction parallel to a longitudinal direction of the source-line corresponding light-transmitting portion in a plan view of the mask.

3. The mask of claim 1, wherein the source-line corresponding light-transmitting portion is positioned between the first-drain-contact-terminal corresponding light-transmitting portion and the second-drain-contact-terminal corresponding light-transmitting portion in a plan view of the mask.

4. The mask of claim 1, wherein a longitudinal direction of the first-drain-contact-terminal corresponding light-transmitting portion is perpendicular to a longitudinal direction of the source-line corresponding light-transmitting portion in a plan view of the mask.

5. The mask of claim 1, wherein the first-drain-contact-terminal corresponding light-transmitting portion and the second-drain-contact-terminal corresponding light-transmitting portion are symmetrical to each other with reference to the source-line corresponding light-transmitting portion in a plan view of the mask.

6. The mask of claim 1, further comprising: a second light-blocking portion, which abuts at least one of the source-line corresponding light-transmitting portion, the first-drain-contact-terminal corresponding light-transmitting portion, and the second-drain-contact-terminal corresponding light-transmitting portion, wherein a size of the second light-blocking portion is unequal to a size of the first light-blocking portion.

7. A method for manufacturing semiconductor device, the method comprising:
  forming a transistor that comprises a gate electrode, a source electrode, and a drain electrode;
  forming a dielectric layer on the transistor, wherein a first portion of the dielectric layer overlaps the source electrode, and wherein a second portion of the dielectric layer overlaps the drain electrode;
  using a mask for removing the first portion of the dielectric layer to form a first space when using the mask for removing the second portion of the dielectric layer to form a second space, wherein the mask comprises a source-line corresponding light-transmitting portion and a first-drain-contact-terminal corresponding light-transmitting portion, wherein the source-line corresponding light-transmitting portion corresponds to the source line, wherein the first-drain-contact-terminal corresponding light-transmitting portion corresponds to the first drain contact terminal and is smaller than the source-line corresponding light-transmitting portion; and
  providing a first conductive material set in the first space for forming a source line when providing a second conductive material set in the second space for forming a first drain contact terminal.

8. The method of claim 7, wherein the mask comprises a first light-blocking portion, which abuts at least one of the source-line corresponding light-transmitting portion and the first-drain-contact-terminal corresponding light-transmitting portion.

9. The method of claim 8,
  wherein the semiconductor device further comprises a second drain contact terminal, and
  wherein the mask further comprises a second-drain-contact-terminal corresponding light-transmitting portion, which corresponds to the second drain contact terminal.

10. The method of claim 9, wherein the first light-blocking portion is positioned between the first-drain-contact-terminal corresponding light-transmitting portion and the second-drain-contact-terminal corresponding light-transmitting portion in a direction parallel to a longitudinal direction of the source-line corresponding light-transmitting portion in a plan view of the mask.

11. The method of claim 9, wherein the source-line corresponding light-transmitting portion is positioned between the first-drain-contact-terminal corresponding light-transmitting portion and the second-drain-contact-terminal corresponding light-transmitting portion in a plan view of the mask.

12. The method of claim 9, wherein a longitudinal direction of the first-drain-contact-terminal corresponding light-transmitting portion is perpendicular to a longitudinal direction of the source-line corresponding light-transmitting portion in a plan view of the mask.

13. The method of claim 9, wherein the first-drain-contact-terminal corresponding light-transmitting portion and the second-drain-contact-terminal corresponding light-transmitting portion are symmetrical to each other with reference to the source-line corresponding light-transmitting portion in a plan view of the mask.

14. The method of claim 9,
  wherein the mask further comprises a second light-blocking portion, which abuts at least one of the source-line corresponding light-transmitting portion, the first-drain-contact-terminal corresponding light-transmitting portion, and the second-drain-contact-terminal corresponding light-transmitting portion, and
  wherein a size of the second light-blocking portion is unequal to a size of the first light-blocking portion.

15. The method of claim 8, further comprising: positioning the mask such that the source-line corresponding light-transmitting portion overlaps the source electrode and such that the first-drain-contact-terminal corresponding light-transmitting portion overlaps the drain electrode.

16. The method of claim 7, further comprising:
  forming a first metal silicide member on the source electrode; and
  forming a second metal silicide member on the drain electrode,
  wherein the first conductive material set overlaps the first metal silicide member, and
  wherein the second conductive material set overlaps the second metal silicide member.

17. The method of claim 7, wherein the dielectric layer comprises an interlayer dielectric layer and an etch stop layer, and wherein both of the source line and the first drain contact terminal are formed after at least one of the interlayer dielectric layer and the etch stop layer has been removed.

18. The method of claim 7, wherein the first conductive material set is a first portion of a metal material layer, and wherein the second conductive material set is a second portion of the metal material layer.

19. The method of claim 17, wherein the metal material layer is formed of at least one of tungsten, cobalt, and titanium.

20. The method of claim 7, further comprising: reducing a height of the first conductive material set to be below a height of the gate electrode; and reducing a height of the second conductive material set to be below the height of the gate electrode.

* * * * *